United States Patent
Kita et al.

(10) Patent No.: US 8,889,027 B2
(45) Date of Patent: Nov. 18, 2014

(54) METHOD OF PRODUCTION OF NANOCOMPOSITE THERMOELECTRIC CONVERSION MATERIAL

(75) Inventors: Takuji Kita, Numazu (JP); Junnya Murai, Susono (JP); Tomoharu Kataoka, Susono (JP); Michael Paul Rowe, Pinckney, MI (US)

(73) Assignees: Toyota Jidosha Kabushiki Kaisha, Toyota-shi (JP); Toyota Motor Engineering & Manufacturing North America, Inc., Erlanger, KY (US)

( * ) Notice: Subject to any disclaimer, the term of this patent is extended or adjusted under 35 U.S.C. 154(b) by 174 days.

(21) Appl. No.: 13/422,318

(22) Filed: Mar. 16, 2012

(65) Prior Publication Data
US 2013/0240775 A1 Sep. 19, 2013

(51) Int. Cl.
H01L 35/16 (2006.01)
H01L 35/18 (2006.01)

(52) U.S. Cl.
USPC ..................................................... 252/62.3 T

(58) Field of Classification Search
USPC ................................ 252/62.3 T; 136/238, 240
See application file for complete search history.

(56) References Cited

U.S. PATENT DOCUMENTS 8,044,292 B2 * 10/2011 Xiao et al. ..................... 136/200
2008/0087314 A1 4/2008 Xiao et al.

FOREIGN PATENT DOCUMENTS

JP 2008-147625 A 6/2008

* cited by examiner

*Primary Examiner* — Carol M Koslow
(74) *Attorney, Agent, or Firm* — Gifford, Krass, Sprinkle, Anderson & Citkowski, P.C.

(57) ABSTRACT

A nanocomposite thermoelectric conversion material composed of a $Bi_2(Te_{1-x}Se_x)_3$ thermoelectric conversion material (where $0 \leq x < 1$) as a matrix in which ceramic phonon scattering particles are dispersed. The nanocomposite thermoelectric conversion material produced by adjusting a first aqueous solution of a Bi complex to a higher pH value than an isoelectric point of phonon scattering particles, adding phonon scattering particles not modified on their surface to the pH adjusted first aqueous solution, and mixing the first aqueous solution to which phonon scattering particles have been added and a second aqueous solution including at least the former of Te anions and Se anions.

7 Claims, 3 Drawing Sheets

METHOD OF PRODUCTION OF NANOCOMPOSITE THERMOELECTRIC CONVERSION MATERIAL

TECHNICAL FIELD

The present invention relates to method of production of a nanocomposite thermoelectric conversion material comprised of a thermoelectric conversion material matrix in which nanosize phonon scattering particles (PSP) are dispersed.

BACKGROUND ART

A thermoelectric conversion material is an energy material which directly converts thermal energy and electrical energy based on two basic thermoelectric effects: the Seebeck effect and the Peltier effect.

As indicators for evaluation of the performance of a thermoelectric conversion material, a power factor $P=S^2\sigma$ and dimensionless figure of merit $ZT=(S^2\sigma/\kappa)T$ are used. Here, S: Seebeck coefficient, $\sigma$: conductivity, $\kappa$: thermal conductivity, T: absolute temperature. That is, to obtain a good thermoelectric characteristic, it is necessary that the Seebeck coefficient S and the conductivity $\sigma$ be high and the thermal conductivity $\kappa$ be low.

To reduce the thermal conductivity $\kappa$, making the phonons, one of the factors in thermal conductivity, scatter is effective. A nanocomposite thermoelectric conversion material comprised of a thermoelectric conversion material matrix in which nanosize phonon scattering particles (PSP) are dispersed has been proposed.

As such a method of production of a nanocomposite thermoelectric conversion material, Japanese Patent Publication (A) No. 2008-147625 discloses a nanocomposite thermoelectric conversion material comprised of silica nanoparticles or other core particles on the surface of which $Bi_2(Te,Se)_3$ or another thermoelectric conversion material is grown as a shell to thereby obtain core/shell particles, wherein the core/shell particles are combined with each other to form a continuous phase constituted by a thermoelectric conversion material matrix by the shell and wherein, in the matrix, the core particles are thereby dispersed as phonon scattering particles.

Here, the core/shell particles comprised of the phonon scattering particles (for example silica) as the cores and the thermoelectric conversion material (for example $Bi_2(Te,Se)_3$) as the shells are prepared as follows:

As shown in FIG. 1, (1) a surface U of a silica particle P is modified, (2) $Bi^{3+}$ cations are bonded with the functional groups of this modifier Q to form a complex, and (3) the $Bi^{3+}$ cations of this complex are bonded with the $Te^{2-}$ anions and $Se^{2-}$ anions to (4) form $Bi_2(Te,Se)_3$ particles on the surface U. Along with the progress in formation of $Bi_2(Te,Se)_3$ on the surface U, as shown in FIG. 1(5), the phonon scattering particle P is surrounded by the $Bi_2(Te,Se)_3$ thermoelectric conversion material. By combining a large number of phonon scattering particles P in this state, as shown in FIG. 1(6), a nanocomposite thermoelectric conversion material comprised of a $Bi_2(Te,Se)_3$ thermoelectric conversion material as a matrix in which phonon scattering particles P are dispersed to a high degree is obtained.

This conventional method features the modification of (imparting functional groups to) the surface of the phonon scattering particles, formation of a Bi complex with the functional groups of this modifier, and reaction with the anions of Te and Se.

If making the $Bi^{3+}$ cations directly react with the $Te^{2-}$ anions and selenium$^{2-}$ anions without modifying (imparting functional groups to) the surface U of the phonon scattering particles P, precipitates end up being rapidly formed in the reaction solution aside from the phonon scattering particle surface U, so phonon scattering particles P cannot be sufficiently taken into the precipitates formed, the excess phonon scattering particles P end up coagulating with each other, and a high dispersion state cannot be obtained.

In the conventional method, the phonon scattering particle surface U is modified, Bi complexes are formed, and Te and Se anions are reacted with this, whereby precipitates of $Bi_2(Te,Se)_3$ are preferentially formed at the surface U of the phonon scattering particles P. Furthermore, by using a reaction involving Bi complexes, since the reaction speed of $Te^{2-}$ anions and $Se^{2-}$ anions is slower compared with $Bi^{3+}$ cations alone, rapid formation of precipitates at locations aside from the phonon scattering particle surface can be prevented.

According to this conventional method, it is possible to chemically cause the formation of $Bi_2(Te,Se)_3$ precipitates at the surface U of the phonon scattering particles P, so it is possible to obtain a nanocomposite thermoelectric conversion material which comprises a thermoelectric conversion material matrix in which nanosize phonon scattering particles are included in a highly dispersed state.

However, the nanocomposite thermoelectric conversion material obtained by this method, as shown in FIGS. 1(5) and (6), has organic phases derived from the modifier remaining at the surfaces of the cores, that is, phonon scattering particles. These not only lower the phonon scattering effect due to the phonon scattering particles, but also lower the conductivity of the nanocomposite thermoelectric conversion material, so result in the defect of the thermoelectric conversion performance dropping.

SUMMARY OF INVENTION

The present invention has as its object the provision of a method of production of a nanocomposite thermoelectric conversion material which has a high thermoelectric conversion performance without modifying the surface of the phonon scattering particles and thereby preventing the conventional defects due to an organic phase derived from a modifier.

To achieve this object, according to the present invention, there is provided a method of production of a nanocomposite thermoelectric conversion material comprised of a $Bi_2(Te_{1-x}, Se_x)_3$ thermoelectric conversion material (where $0 \leq x < 1$) as a matrix in which ceramic phonon scattering particles are dispersed, the method of production of a nanocomposite thermoelectric conversion material including a step of adjusting a first aqueous solution of a Bi complex to a higher pH value than an isoelectric point of phonon scattering particles, a step of adding phonon scattering particles not modified on their surface to the pH adjusted first aqueous solution, and a step of mixing the first aqueous solution to which phonon scattering particles have been added and a second aqueous solution including at least the former of Te anions and Se anions.

According to the present invention, the phonon scattering particles are added to a solution of a Bi complex adjusted to a pH value higher than the isoelectric point of the phonon scattering particles so that the surface of the phonon scattering particles is negatively charged, so this surface adsorbs the $Bi^{3+}$ cations. The $Bi^{3+}$ cations bond with $Te^{2-}$ anions and $Se^{2-}$ anions whereby $Bi_2(Te,Se)_3$ precipitates are formed. In this way, $Bi_2(Te,Se)_3$ is formed on the surface of the phonon scattering particles on a preferential basis. Furthermore, the $Bi^{3+}$ cations are present in the solution as a complex, so compared with single $Bi^{3+}$ cations, the reaction speed of the $Te^{2-}$ anions and $Se^{2-}$ anions is slower, so it is possible to prevent the rapid formation of precipitates at locations other than the phonon scattering particle surface. Due to this, according to the method of the present invention, it is possible to chemically form a precipitate of $Bi_2(Te,Se)_3$ on the surface of a modifier of phonon scattering particles, so it is possible to obtain a nanocomposite thermoelectric conversion material comprised of a thermoelectric conversion material matrix in which nanosize phonon scattering particles are present in a highly dispersed state without the otherwise unavoidable deterioration of the thermoelectric conversion characteristics due to organic matter derived from a modifier.

DESCRIPTION OF EMBODIMENTS

The feature of the present invention is that the modification of the phonon scattering particle surface, which was essential in the prior art for forming Bi complexes on the phonon scattering particle surface, is not performed. Instead, the pH value of a solution containing the phonon scattering particles is made a value higher than the isoelectric point of the phonon scattering particles to thereby cause the phonon scattering particle surface to be negatively charged and make the Bi complexes be adsorbed on the phonon scattering particle surface. Due to this, it is possible to completely eliminate the residual organic phase at the phonon scattering particle surface, which was unavoidable in the past, and possible to produce a nanocomposite thermoelectric conversion material provided with superior thermoelectric conversion characteristics without causing a drop in the conductivity and scattering effect due to the presence of the organic phase.

Figure 1:
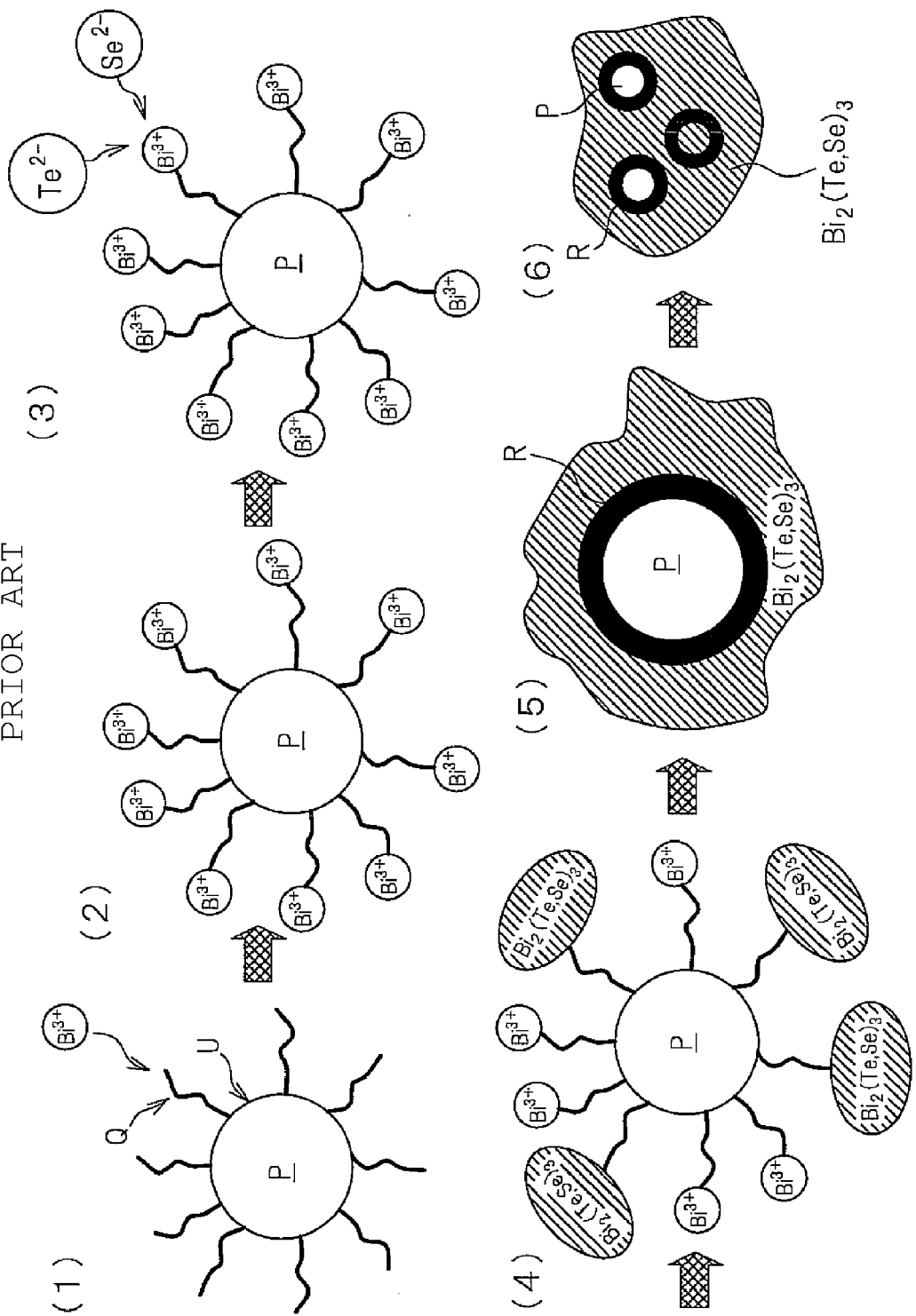
FIG. 1 schematically shows a method of production of a nanocomposite thermoelectric conversion material according to the related art.
Figure 2:
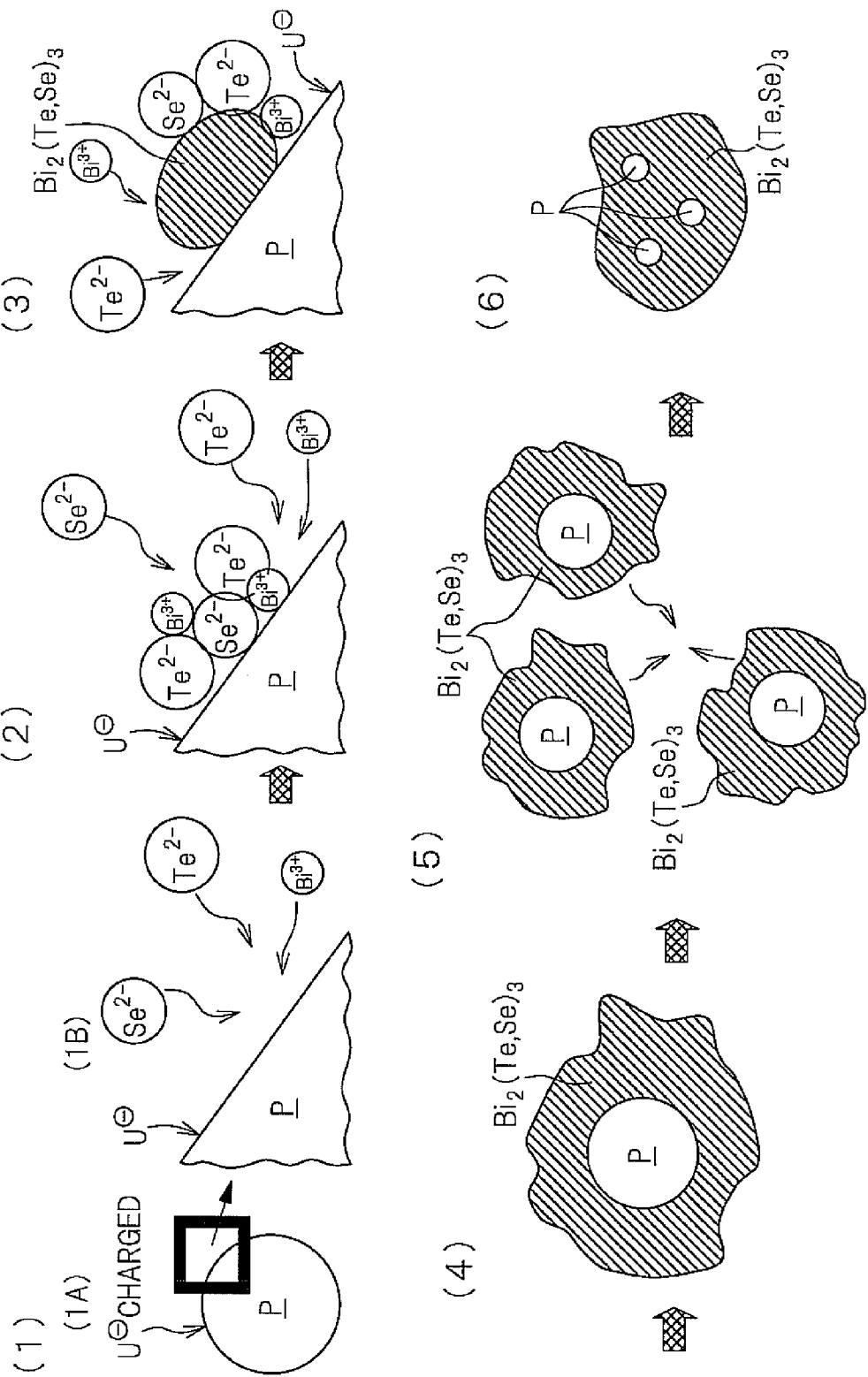
FIG. 2 schematically shows a method of production of a nanocomposite thermoelectric conversion material according to the present invention.

Referring to FIG. 2, a method of production of nanocomposite thermoelectric conversion material according to the present invention will be explained.

As shown in FIG. 2(1A), in a solution adjusted to a pH value higher than the isoelectric point of the phonon scattering particles P, the phonon scattering particles P are negatively charged. As shown in FIG. 2(1B), this negatively charged surface U adsorbs the $Bi^{3+}$ cations. As shown in FIG. 2(2)→FIG. 2(3), the $Bi^{3+}$ cations on the surface U are supplied with $Te^{2-}$ anions and $Se^{2-}$ anions to form a $Bi_2(Te,Se)_3$ precipitate. Along with the formation of the $Bi_2(Te,Se)_3$ at the surface U, as shown in FIG. 2(4), the phonon scattering particles P are surrounded by the $Bi_2(Te,Se)_3$ thermoelectric conversion material in state. By combining the large number of phonon scattering particles P in this state as shown in FIG. 2(5), as shown in FIG. 2(6), a nanocomposite thermoelectric conversion material comprised of a $Bi_2(Te,Se)_3$ thermoelectric conversion material as a matrix in which phonon scattering particles P are dispersed to a high degree is obtained.

The nanocomposite thermoelectric conversion material obtained by the present invention does not have any of the conventional organic phase R on the surface of the phonon scattering particles P. Due to this, there is no drop in the conductivity and phonon scattering effect which was unavoidable in the past due to the presence of the organic phase, so a nanocomposite thermoelectric conversion material provided with a high thermoelectric conversion performance is obtained.

The important feature of the present invention is that the pH value of the reaction solution is adjusted to a value higher than the isoelectric point of the phonon scattering particles used so as to thereby make the surface of the phonon scattering particles be negatively charged and make it adsorb $Bi^{3+}$ cations, these are made to bond with $Te^{2-}$ anions and $Se^{2-}$ anions to thereby substantially limit the precipitation reaction sites of the $Bi_2(Te,Se)_3$ thermoelectric conversion material to the phonon scattering particle surface, the individual phonon scattering particles are surrounded by the thermoelectric conversion material, and a large number of phonon scattering particles are combined in this state so as to obtain a nanocomposite thermoelectric conversion material comprised of a thermoelectric conversion material matrix in which phonon scattering particles are dispersed to a high degree.

The isoelectric point of the phonon scattering particles differs as follows according to the material of the phonon scattering particles.

<Isoelectric Points of Various Phonon Scattering Particles (pH Value)>

$SiO_2$: 1.0 to 2.0
$TiO_2$: 5 to 6
$ZrO_2$: about 6.7
$Al_2O_3$: 7.0 to 9.0
ZnO: 8.7 to 9.7
MgO: 12.1 to 12.7

In accordance with the isoelectric point of the phonon scattering particles used, the pH value of the solution is adjusted to be higher. Due to this, the surface of the phonon scattering particles is negatively charged and $Bi^{3+}$ cations of Bi complexes in the solution are adsorbed at the phonon scattering particle surface. The $Bi^{3+}$ cations of the Bi complexes have lower reactivity compared with $Bi^{3+}$ cations alone, so no adsorption or coagulation occurs at locations other than the phonon scattering particle surface (solution container etc.) and the cations are preferentially adsorbed at the phonon scattering particle surface.

Furthermore, $Bi^{3+}$ cations of Bi complexes are lower in reactivity with $Te^{2-}$ anions and $Se^{2-}$ anions compared with $Bi^{3+}$ cations alone, so there is no rapid formation of $Bi_2(Te,Se)_3$ precipitates and the $Bi_2(Te,Se)_3$ precipitates can reliably grow on the phonon scattering particle surface. That is, it is important to slowly make the $Bi_2(Te,Se)_3$ precipitates grow on the phonon scattering particle surface. For this, it is advantageous to slowly add a Te and Se material dropwise and reduce the number of reactable ions.

Typically, the reaction vessel is charged with a Bi material constituted by the Bi complexes and a slurry of phonon scattering particles. To this, the Te and Se material solutions are added dropwise. Here, the Te and Se materials have to be in a state enabling formation of anions (monovalent and bivalent) for forming precipitates with the Bi ions. That is, the Te material and Se material have to be solid or liquid compounds able to supply anions. Preferably, the compound contains no metals, especially alkaline metals such as Na, K, Ca, in the form of a simple substance. Metals in the atomic state are likely to act as a dopant. Preferable compounds not containing metals include diphenyl ditelluride ($C_6H_5$—Te—Te—

$C_6H_5$), diphenyl telluride ($C_6H_5$—Te—$C_6H_5$), diethyl ditelluride ($C_2H_5$—Te—Te—$C_2H_5$), diethyl telluride ($C_2H_5$—Te—$C_2H_5$), tellurium hydride ($H_2$Te), diphenyl diselenide ($C_6H_5$—Se—Se—$C_6H_5$), &phenyl diphenyl selenide ($C_6H_5$—Se—$C_6H_5$), diethyl diselenide ($C_2H_5$—Se—Se—$C_2H_5$), diethyl selenide ($C_2H_5$—Se—$C_2H_5$), and selenium hydride ($H_2$Se).

That is, the Te material and Se material may be a metal telluride and selenium compound. The metal may be an alkali metal or an alkaline earth metal. The alkali metal may be Na or K, while the alkaline earth metal may be one of Mg, Ca, Sr, and Ba.

EXAMPLES

Below, working examples will be used to explain the present invention in more detail.

According to the method of the present invention, a $Bi_2$(Te, Se)$_3$/$SiO_2$ nanocomposite thermoelectric conversion material comprised of a $Bi_2$(Te,Se)$_3$ thermoelectric conversion material as a matrix in which phonon scattering particles constituted by $SiO_2$ nanoparticles are dispersed is produced.

[I] Preliminary Preparations: Synthesis of Te Material and Se Material (1) A flask was charged with water (15 ml) and flushed with nitrogen (15 minutes), then metal Te (8.00 mmol) and metal Se (1.41 mmol) were introduced.

(2) While stirring, a sodium borohydride $NaBH_4$ aqueous solution (28.3 mmol/20 ml $H_2O$) was introduced. After this, the stirring was continued overnight.

(3) The result was filtered in a glove box of an inert gas (Ar) atmosphere, then was recovered as an aqueous solution.

[II] Synthesis of $Bi_2$(Te,Se)$_3$/$SiO_2$ Nanocomposite Thermoelectric Conversion Material (1) Bi citrate (6.28 mmol) was dissolved in ammonia water (13 ml). The solution was then adjusted to pH9.0 to 10—sufficiently higher than the isoelectric point of $SiO_2$ of pH 1.0 to 2.0. Furthermore, a nanosilica slurry (made by Admatechs, average particle size 5 nm, 2.9 g) was added, then the reaction vessel was flushed with nitrogen (30 minutes).

(2) While stirring, the Te and Se material solution which was synthesized in the preliminary preparations [1] was added dropwise at a speed of 5 ml/min. The dropping speed can be suitably set by preliminary experiments in accordance with the Bi concentration, Te and Se concentrations, stirring speed, and reaction solution temperature.

(3) In the nitrogen atmosphere, water (400 ml) and ethanol (300 ml) were used for successive washing and filtering to recover a $Bi_2$(Te,Se)$_3$/$SiO_2$ nanocomposite thermoelectric conversion material in a powder form.

Figure 3:
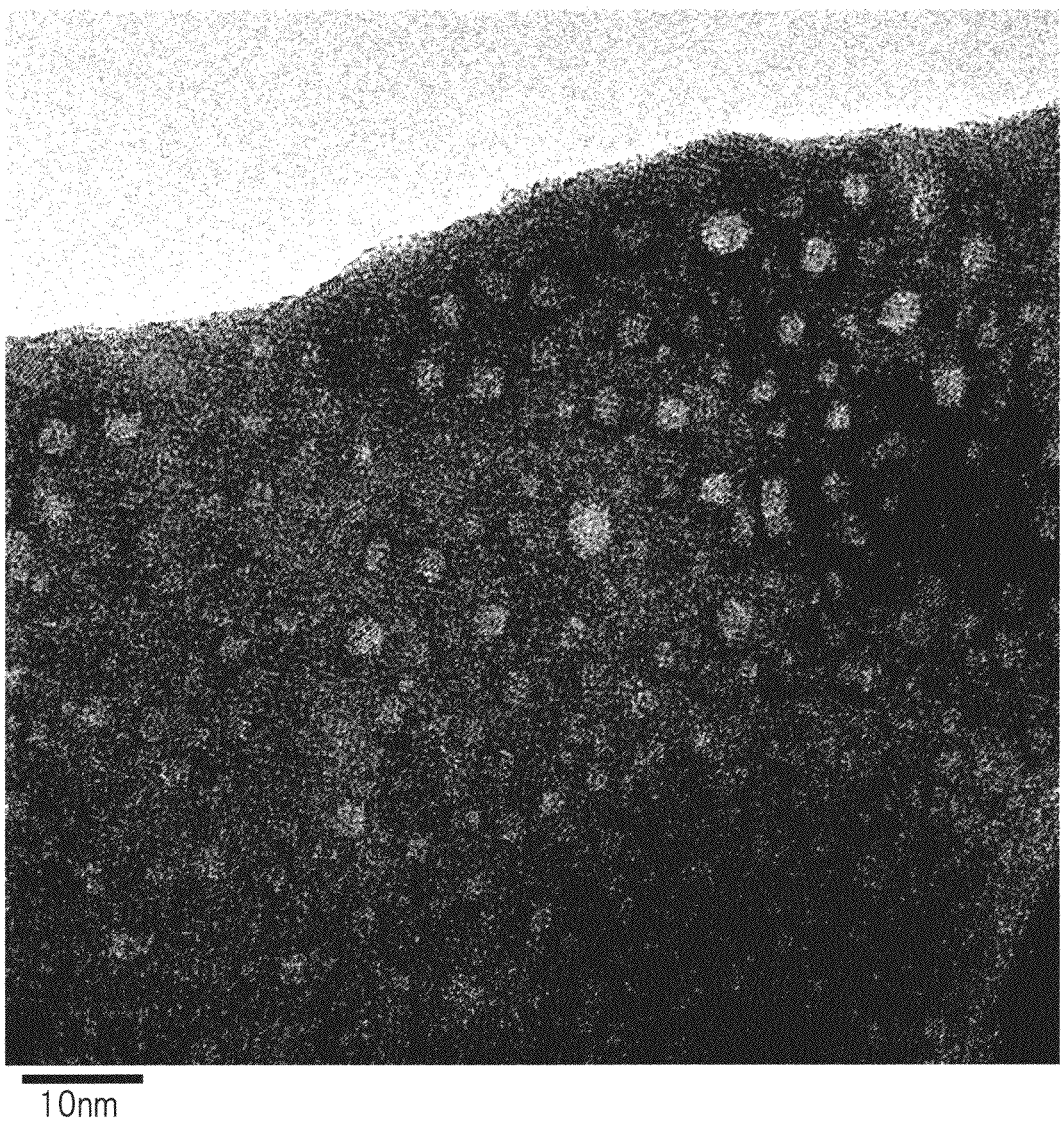
FIG. 3 is a transmission electron microscope (TEM) image of a $Bi_2(Te_{1-x},Se_x)_3$ thermoelectric conversion material/$SiO_2$ nanocomposite thermoelectric conversion material which is fabricated in an embodiment.

The obtained powder was sintered in an Ar atmosphere at 370° C. under 100 MPa to obtain a $Bi_2$(Te,Se)$_3$/$SiO_2$ nanocomposite thermoelectric conversion material in a bulk. FIG. 3 shows a transmission electron microscope (TEM) image of this bulk. The $SiO_2$ nanoparticles are observed as bright dots in the dark matrix. It is learned that $SiO_2$ nanoparticles of several nm size functioning as the phonon scattering particles are dispersed to a high degree in the $Bi_2$(Te,Se)$_3$ matrix.

Evaluation of Thermoelectric Conversion Characteristics

The bulk of the obtained $Bi_2$(Te,Se)$_3$/$SiO_2$ nanocomposite thermoelectric conversion material was measured in the following way for thermal conductivity κ and electrical resistance ρ.

<Thermal Conductivity κ>

Measurement method: Measured by ordinary method.
Sample: 4 mm square×1.1 mm thick.

Measurement temperature (average temperature): Three levels of 27° C., 35° C., and 45° C.

Temperature difference at top and bottom surfaces of sample: Respectively, 50° C., 30° C., and 30° C.

Measurement value: In each case, κ=0.45 W/m·K.

<Electrical Resistance ρ>

Measurement apparatus: ZEM-1 (made by ULVAC RICOH)

Measurement system: 4 terminal method.
Measurement temperature: 25° C.
Measurement value: ρ=21 μΩ·m <Evaluation>

Conventional Value (Value in Literature)

$$\kappa=1.5 \text{ W/m·K}, \rho=21 \text{ μΩ·m} \qquad (1)$$

Source: 10th International Conference on Thermoelectrics, pp. 22-31, 1991.

Summary of Method of Production:

Metallic Bi, Te and Se materials are placed in a quartz tube and vacuum-encapsulated. The tube is then placed in a rocking furnace and the materials contained therein are melted and solidified to form a polycrystalline body. After annealing at 585° C., the polycrystalline body is then changed to a single crystalline body by travelling heater process.

$$\kappa=1 \text{ to } 3 \text{ W/m·K}, \rho=15 \text{ to } 24 \text{ μΩ·m} \qquad (2)$$

Source: Proceedings of 17th International Conference on Thermoelectrics, pp. 174-177, 1998.

Summary of Method of Production:

Method 1: Metallic Bi, Te and Se materials are vacuum-encapsulated in a quartz tube and subjected to melting Bridgemann process at 800° C. for 10 hr to form a single crystalline body using a rocking furnace. The thus-produced single crystalline body is crushed to a 90-250 μm powder, which is then sintered at 500° C. for 30 min.

Method 2: Metallic Bi, Te and Se materials, together with mill balls, are placed in a container in an Ar atmosphere and processed at 1200 rpm for mechanical alloying. The obtained powder is sintered at 550° C. for 30 min.

The characteristic of the thermoelectric conversion material is, as explained above, expressed by the dimensional figure of merit $ZT \propto (S^2/\kappa\rho)T$. Here, S: Seebeck coefficient, κ: thermal conductivity, ρ: electrical resistance, and T: absolute temperature.

From the above data values, according to the present invention, κ is ⅓ or less of the conventional value while ρ is the equivalent level to 1.5×. Therefore, the dimensionless figure of merit ZT is the present invention value>conventional value×3×⅔=conventional value×2, that is, is improved at least two-fold.

Note that in the present embodiment, as the Bi material, Bi citrate was used, but any Bi complex, not a usual inorganic salt (for example, Bi nitrate etc.), falls in reactivity, so can be used. A Bi complex can be formed by adding organic molecules which form complexes with $Bi^{3+}$ cations to an ordinary inorganic salt for complexing.

Further, in the present embodiment, the Te material and Se material solution was added dropwise to the Bi complex solution, but in the method of the present invention, it is important to slow the speed of formation of precipitates, so even if adding the Bi complex solution dropwise to the solution of the Te material and Se material, it is believed that a similar action can be obtained.

INDUSTRIAL APPLICABILITY

According to the present invention, there is provided a method of production of a nanocomposite thermoelectric conversion material which has a high thermoelectric conversion performance without modifying the surface of the phonon scattering particles and thereby preventing the conventional defects due to an organic phase derived from a modifier.

REFERENCE SIGNS LIST

P: phonon scattering particles
U: phonon scattering particle surface
Q: functional group of modifier
R: organic phase derived from modifier

The invention claimed is:

1. A method of production of a nanocomposite thermoelectric conversion material comprised of a $Bi_2(Te_{1-x},Se_x)_3$ thermoelectric conversion material (where $0 \leq x < 1$) as a matrix in which ceramic phonon scattering particles are dispersed,
the method of production of a nanocomposite thermoelectric conversion material including
a step of adjusting a first aqueous solution of a Bi complex to a higher pH value than an isoelectric point of phonon scattering particles,
a step of adding phonon scattering particles not modified on their surface to said pH adjusted first aqueous solution, and
a step of mixing said first aqueous solution to which phonon scattering particles have been added and a second aqueous solution including Te anions or Te anions and Se anions.

2. A method as set forth in claim 1, wherein said second aqueous solution is an aqueous solution of a solid or liquid compound able to supply Te anions or Te anions and Se anions.

3. A method as set forth in claim 2, wherein said compound is a metal telluride compound or a metal telluride and a selenium compound.

4. A method as set forth in claim 3, wherein said metal is an alkali metal or an alkaline earth metal.

5. A method as set forth in claim 4, wherein said alkali metal is Na or K and wherein said alkaline earth metal is one of Mg, Ca, Sr, and Ba.

6. A method as set forth in claim 2, wherein said compound contains no metals as a simple substance.

7. A method as set forth in claim 6, wherein said compound is at least one of diphenyl ditelluride ($C_6H_5$—Te—Te—$C_6H_5$), diphenyl telluride ($C_6H_5$—Te—$C_6H_5$), diethyl ditelluride ($C_2H_5$—Te—Te—$C_2H_5$), diethyl telluride ($C_2H_5$—Te—$C_2H_5$), tellurium hydride ($H_2Te$), diphenyl diselenide ($C_6H_5$—Se—Se—$C_6H_5$), diphenyl selenide ($C_6H_5$—Se—$C_6H_5$), diethyl diselenide ($C_2H_5$—Se—Se—$C_2H_5$), diethyl selenide ($C_2H_5$—Se—$C_2H_5$), and selenium hydride ($H_2Se$).

* * * * *